(12) United States Patent
Rosenfeld et al.

(10) Patent No.: US 7,743,502 B2
(45) Date of Patent: Jun. 29, 2010

(54) CHEMICALLY COMPATIBLE, LIGHTWEIGHT HEAT PIPE

(75) Inventors: John H. Rosenfeld, Lancaster, PA (US); G. Yale Eastman, Lancaster, PA (US)

(73) Assignee: Thermal Corp. DE (US)

( * ) Notice: Subject to any disclaimer, the term of this patent is extended or adjusted under 35 U.S.C. 154(b) by 586 days.

(21) Appl. No.: 11/363,806

(22) Filed: Feb. 28, 2006

(65) Prior Publication Data

US 2006/0144574 A1   Jul. 6, 2006

Related U.S. Application Data

(63) Continuation of application No. 10/643,435, filed on Aug. 19, 2003, now Pat. No. 7,069,978, which is a continuation of application No. 09/753,858, filed on Jan. 3, 2001, now abandoned.

(51) Int. Cl.
*B21D 53/06* (2006.01)
*B23P 6/00* (2006.01)
*C22C 23/00* (2006.01)
*F28D 15/00* (2006.01)
*H05K 7/20* (2006.01)

(52) U.S. Cl. ............................. 29/890.032; 29/890.03; 29/890.035; 148/420; 165/140.21; 165/104.26; 165/104.27; 361/700; 420/402; 420/414

(58) Field of Classification Search ............ 29/890.032; 165/905, 104.33, 104.27, 104.26, 104.21; 361/700; 420/414
See application file for complete search history.

(56) References Cited

U.S. PATENT DOCUMENTS

| 4,018,269 | A |   | 4/1977  | Honda et al. |
|-----------|---|---|---------|--------------|
| 4,082,575 | A | * | 4/1978  | Eastman ................... 428/472.2 |
| 4,196,504 | A | * | 4/1980  | Eastman ................ 29/890.032 |
| 4,197,957 | A |   | 4/1980  | Buhrer |
| 4,292,345 | A |   | 9/1981  | Kolesnik et al. |
| 4,478,275 | A | * | 10/1984 | Ernst ........................... 165/133 |
| 4,696,455 | A |   | 9/1987  | Johnson |
| 4,703,796 | A |   | 11/1987 | Meijer et al. |
| 4,831,965 | A |   | 5/1989  | Brian et al. |
| 4,969,420 | A |   | 11/1990 | McKeon |
| 4,980,133 | A |   | 12/1990 | Koch |
| 5,599,404 | A |   | 2/1997  | Alger |
| 5,771,967 | A |   | 6/1998  | Hyman |
| 5,847,925 | A |   | 12/1998 | Progl et al. |
| 5,855,828 | A | * | 1/1999  | Tuffias et al. ............... 264/29.1 |
| 6,143,428 | A |   | 11/2000 | Bommer et al. |
| 6,193,817 | B1 | * | 2/2001 | King et al. ................... 148/420 |

* cited by examiner

*Primary Examiner*—David P Bryant
*Assistant Examiner*—Alexander P Taousakis
(74) *Attorney, Agent, or Firm*—Michael Best & Friedrich LLP

(57) ABSTRACT

The present invention provides an apparatus including a magnesium alloy vessel that is substantially free of aluminum and zinc, but including magnesium in combination with a gettering metal and a method for making such apparatus. The magnesium alloy vessel has a hollow interior cavity containing a working fluid, with a stable, protective layer formed on the inside wall of the vessel so as to establish non-corrosive compatibility with the working fluid.

18 Claims, 2 Drawing Sheets

CHEMICALLY COMPATIBLE, LIGHTWEIGHT HEAT PIPE

This application is a continuation of copending U.S. application Ser. No. 10/643,435, filed on Aug. 19, 2003 now U.S. Pat. No. 7,069,978, which is itself a continuation of U.S. application Ser. No. 09/753,858, filed on Jan. 3, 2001, now abandoned.

BACKGROUND OF THE INVENTION

A heat pipe is essentially a passive heat transfer device with an extremely high effective thermal conductivity. A two-phase heat transfer mechanism results in heat transfer capabilities from one hundred to several thousand times that of an equivalent piece of copper. Heat pipes are sealed vacuum vessels that are partially filled with a fluid, typically water in electronic cooling applications, which serves as the heat transfer medium. The heat pipe envelope is typically made of cylindrical copper tubing, although rectangular cross sections and other materials are available. The wall of the envelope is lined with a wick structure, which generates the capillary force that pulls the condensate from the condenser section of the heat pipe back to the evaporator section. Since the heat pipe is evacuated and then charged with the working fluid prior to being sealed, the internal pressure is set by the vapor pressure of the working fluid. As heat is applied to a portion of the surface of the heat pipe, the working fluid is vaporized. The vapor at the evaporator section is at a slightly higher temperature and pressure than other areas and creates a pressure gradient that forces the vapor to flow to the cooler regions of the heat pipe. As the vapor condenses on the heat pipe walls, the latent heat of vaporization is transferred to the condenser. The capillary wick then transports the condensate back to the evaporator section. This is a closed loop process that continues as long as the heat is applied.

The orientation and layout of a heat pipe design are important. When the design allows, the heat source should be located below or at the same elevation as the cooling section for best performance. This orientation allows gravity to aid the capillary action, and results in a greater heat carrying capability. If this orientation is unacceptable, then a capillary wick structure such as sintered powder will be necessary. Additionally, heat pipes have the ability to adhere to the physical constraints of the system, and can be bent around obstructions.

There is a recurring need for heat pipes having low mass. There has been an extended effort to devise a method for using aluminum as the envelope and wick material. Much of this effort has been to use water as the preferred working fluid. Previous efforts have been focused on taking advantage of the fact that aluminum oxide is compatible with water, even though aluminum metal is not compatible. The programs have not been successful because of the large difference in thermal expansion between aluminum and its oxide. The resulting stresses cause the oxide layer to crack, often on the first thermal cycle, thereby allowing the water and aluminum to come into contact, resulting in hydrogen generation and heat pipe failure.

The present invention takes advantage of the stabilizing effects of the "getter" type materials, such as zirconium when added to light metals such as magnesium or aluminum. The addition of zirconium to the magnesium provides a more stable oxide and/or nitride, and provides a water-compatible surface. The fact that this alloy is also lighter than aluminum is an added benefit. The reduced thermal stresses which result with this alloy most likely allow the oxide/nitride to maintain its integrity.

Most commercially available magnesium alloys have significant amounts of aluminum, rare earths, and/or zinc as constituents. None of these materials are readily compatible with water. Therefore, an additional objective of the present invention is to specify a water-compatible alloy of magnesium which does not have these non-compatible constituents.

SUMMARY OF THE INVENTION

The present invention is directed to an improvement in heat transfer vessels as used in weight-sensitive applications, e.g., laptop computers, these vessels composed of magnesium and substantially free of aluminum and zinc, these vessels further having a hollow interior cavity containing a working fluid. The improvement comprises the formation of a stable, protective layer on the inside wall of the vessel, the layer establishing compatibility with the working fluid, and preventing base metal corrosion by the working fluid. In some embodiments, the stable protective layer comprises a combination of an oxide of the getter metal (e.g., zirconium, etc.) and an oxide of the base metal (e.g. magnesium, etc.). In a preferred embodiment of the present invention, an alloy with no aluminum or zinc, but with 0.5 to 1 percent (by weight) zirconium, was used. The zirconium oxide helps provide compatibility with water by stabilizing the oxide surface layer in the presence of water, and similarly provides a stabilizing nitride surface in the presence of ammonia.

BRIEF DESCRIPTION OF THE DRAWINGS

These and other features and advantages of the present invention will be more fully disclosed in, or rendered obvious by, the following detailed description of the preferred embodiments of the invention, which are considered together with the accompanying drawings wherein like numbers refer to like parts and further wherein.

DETAILED DESCRIPTION OF THE INVENTION

Figure 1:
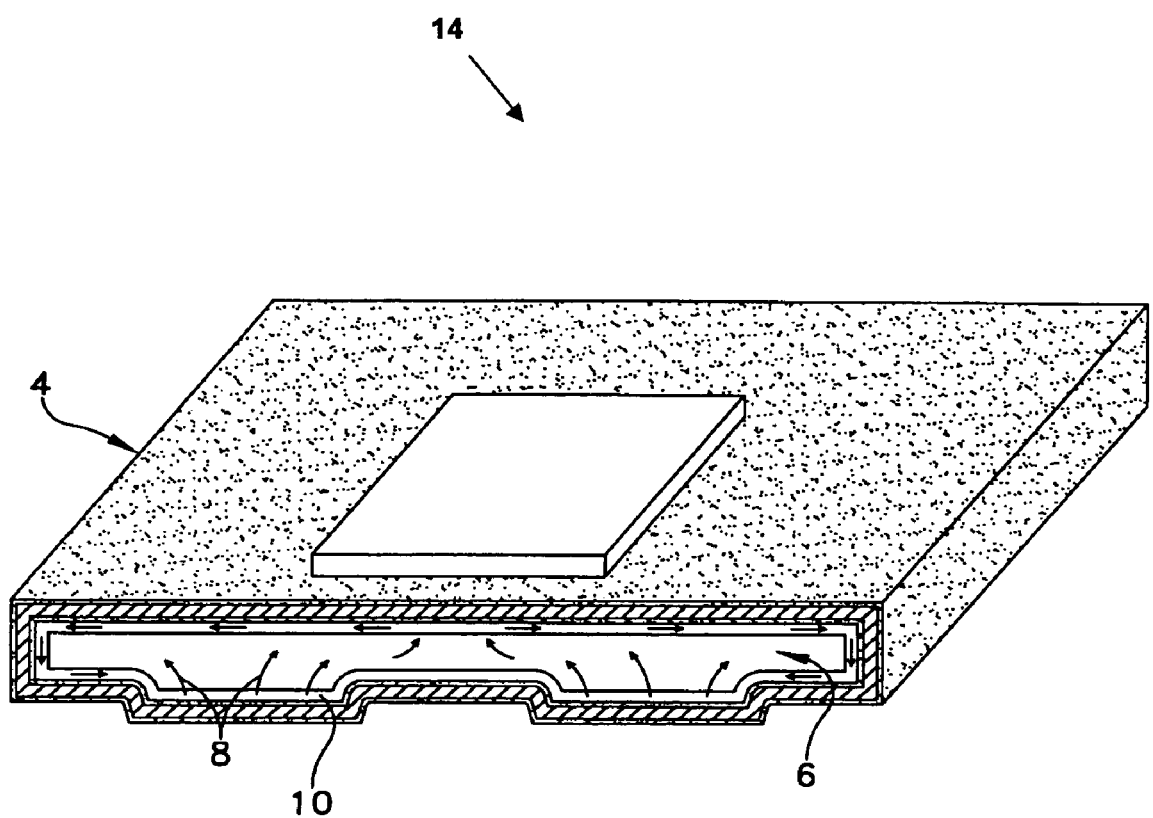
FIG. 1 is a perspective view of a heat pipe formed in accordance with the present invention.
Figure 2:
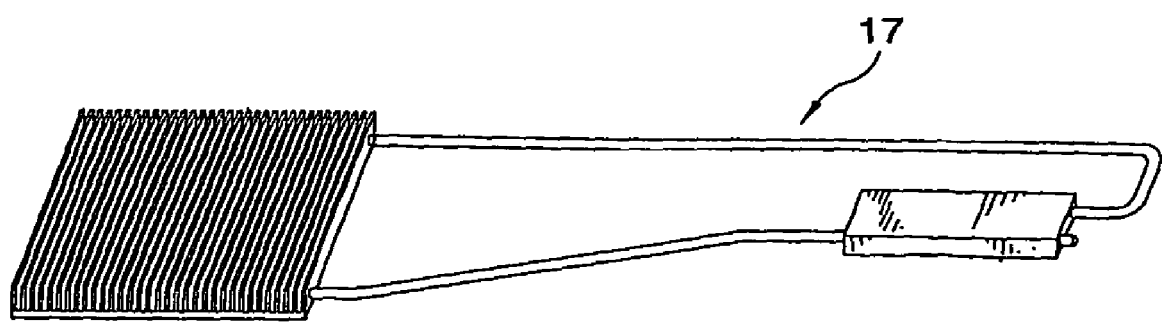
FIG. 2 is a perspective view of a pumped-looped system formed in accordance with the present invention.

The present invention is directed to an improvement in vessels 4 composed of magnesium and substantially free of aluminum and zinc, these vessels 4 having a hollow interior cavity 6 containing a working fluid 8. The stable protective layer 10 will be either an oxide or nitride layer depending on the working fluid 8. For instance, if ammonia is chosen as the working fluid 8, a stable nitride would be formed; in contrast, if water is used as the working fluid 8, a stable oxide would be formed. The preferred vessel 4 for purposes of the present invention is a heat pipe 14, although it is anticipated that other suitable vessels would benefit from the purposes of the present invention as well. Suitable vessels include heat pipe 14 and/or a pumped-looped system 17 (FIGS. 1 and 2).

In a further preferred embodiment of the present invention, the magnesium alloy contains 0.1 to 5 percent of a "gettering" metal or metals e.g., zirconium, titanium, hafnium, yttrium, etc. Amounts of gettering metal of from about 0.1 to 2 percent are preferred, with an amount of about 1% gettering metal, e.g., zirconium, particularly preferred.

A further benefit of the treatment of the present invention can be the strengthening of the primary metal (e.g., magnesium) with alloying materials in excess of the metal's natural solubility. This results in the dispersal of unalloyed particles in grain boundaries, thereby providing a further strengthening effect.

In the testing of the present invention, there have been more than 30 on/off thermal cycles where a Mg/water heat pipe 14 was heated to between 100 to 120° C., and then cooled to room temperature. Note that 1 to 2 of those cycles are normally enough to cause failure in an aluminum/water heat pipe 14. It has been found that there is no degradation in magnesium heat pipes 14. In further testing with more than 50 thermal cycles of a magnesium heat pipe 14 with 0.6 wt % zirconium, no degradation or failure has been observed. Also note that the temperature for fluids within the vessel range from about room temperature (for ammonia) to up to 100° C. (for water).

It is anticipated that the process of the present invention would be effective with aluminum as well. Note that for both aluminum and magnesium systems, the addition of other "getter" alloying metals such as titanium, hafnium and yttrium may also be included in order to increase alloy strength and improve corrosion resistance. The alloys of the present invention are compatible with chemical acids, e.g., water, methanol and other alcohol fluids, as well as chemical bases such as ammonia, pyridine, hydrazine, etc.

While the above description constitutes the preferred embodiments of the present invention, it will be appreciated that the invention is susceptible to modification, variation and change without departing from the proper scope and fair meaning of the accompanying claims.

What is claimed is:

1. A method for manufacturing a heat transfer device comprising the steps of:
    (A) alloying a magnesium base metal that is substantially free of aluminum and zinc to a getter metal so as to form a magnesium getter alloy;
    (B) fabricating said magnesium getter alloy into a vessel having an interior wall defining a hollow interior cavity;
    (C) forming a stable protective layer upon said interior wall, wherein said stable protective layer is in thermally-compatible contact with said interior wall;
    (D) filling at least a portion of said hollow interior cavity with a capillary wick structure;
    (E) evacuating said hollow interior cavity; and
    (F) charging a portion of said hollow interior cavity with a working fluid, wherein said working fluid is in chemically non-reactive contact with said stable protective layer.

2. The method according to claim 1 wherein said getter metal is selected from the group consisting of zirconium, titanium, hafnium and yttrium.

3. The method according to claim 1 wherein zirconium is alloyed to said magnesium base metal in a weight percentage of about 0.1-5.0%.

4. The method according to claim 1 wherein zirconium is alloyed to said magnesium base metal in a weight percentage of about 0.6%.

5. The method according to claim 1 wherein a nitride derivative of said magnesium getter alloy is formed on said interior wall of said vessel as the stable protective layer.

6. The method according to claim 5 wherein ammonia is charged into said hollow interior cavity as said working fluid.

7. The method according to claim 1 wherein an oxide derivative of said magnesium getter alloy is formed on said interior wall of said vessel as the stable protective layer.

8. The method according to claim 7 wherein water is charged into said hollow interior cavity as said working fluid.

9. A method for preventing base metal corrosion in a heat transfer device, comprising the steps of:
    (A) alloying a magnesium metal that is substantially free of aluminum and zinc to a getter metal so as to form a magnesium getter alloy wherein said magnesium getter alloy functions as a base metal for said heat transfer device;
    (B) fabricating said base metal into a vessel having an interior wall defining a hollow interior cavity;
    (C) filling at least a portion of said hollow interior cavity with a capillary wick structure;
    (D) evacuating said hollow interior cavity;
    (E) charging a portion of said hollow interior cavity with a working fluid; and,
    (F) oxidizing said interior wall of said vessel so as to form a stable protective layer, wherein said stable protective layer comprises an oxidation product of said base metal and said working fluid, and further wherein said protective layer inhibits contact between said interior wall and said working fluid so as to prevent corrosive interaction by said working fluid upon said interior wall.

10. The method according to claim 9 wherein said getter metal is selected from the group consisting of zirconium, titanium, hafnium and yttrium.

11. The method according to claim 9 wherein zirconium is alloyed to said magnesium metal in a weight percentage of about 0.1-5.0%.

12. The method according to claim 9 wherein zirconium is alloyed to said magnesium metal in a weight percentage of about 0.6%.

13. The method according to claim 9 wherein ammonia is charged into said hollow interior cavity as said working fluid.

14. The method according to claim 9 wherein water is charged into said hollow interior cavity as said working fluid.

15. A method for preventing hydrogen gas generation in a heat transfer device, comprising the steps of:
    (A) alloying a magnesium metal, substantially free of aluminum and zinc, to a getter metal so as to form a magnesium getter alloy;
    (B) fabricating said magnesium getter alloy into a vessel having an interior wall defining a hollow interior cavity;
    (C) forming a stable protective layer upon said interior wall, wherein said stable protective layer comprises substantially a combination of an oxide of said getter metal and an oxide of said magnesium metal, and further wherein said getter metal oxide reacts to absorb hydrogen gas produced within said hollow interior cavity;
    (D) filling at least a portion of said hollow interior cavity with a capillary wick structure;
    (E) evacuating said hollow interior cavity; and
    (F) charging a portion of said hollow interior cavity with a working fluid, said working fluid being liquid water.

16. The method according to claim 15 wherein said getter metal is selected from the group consisting of zirconium, titanium, hafnium and yttrium.

17. The method according to claim 15 wherein zirconium is alloyed to said magnesium metal in a weight percentage of about 0.1-5.0%.

18. The method according to claim 15 wherein zirconium is alloyed to said magnesium metal in a weight percentage of about 0.6%.

* * * * *